United States Patent

Gates

[11] Patent Number: 6,111,750
[45] Date of Patent: Aug. 29, 2000

[54] ELECTRONIC APPARATUS

[75] Inventor: William George Gates, Wolverton, United Kingdom

[73] Assignee: Lucent Technologies Inc., Murray Hill, N.J.

[21] Appl. No.: 09/232,418

[22] Filed: Jan. 15, 1999

[51] Int. Cl.[7] .................................................. H05K 7/20
[52] U.S. Cl. ...................... 361/700; 361/697; 361/698; 361/700; 361/717; 257/713; 257/717; 174/15.1; 174/16.3; 165/104.21; 165/104.33
[58] Field of Search ...................... 361/694–697, 361/687, 699–706, 711, 717–719, 721, 734, 818, 802; 165/104.21, 104.33, 80.2, 104.22, 46; 174/15.1, 15.2, 16.3; 257/715, 717; 62/172, 259.2, 418, 419, 426; 415/114, 177, 178; 417/13, 44.8, 92, 366, 377

[56] References Cited

U.S. PATENT DOCUMENTS 5,764,483  6/1998  Ohashi et al. .......................... 361/699

FOREIGN PATENT DOCUMENTS 357080748A  5/1982  Japan .............................. H01L 23/46
405079779A  3/1993  Japan .............................. F28D 15/02

*Primary Examiner*—Leo P. Picard
*Assistant Examiner*—Michael Datskovsky

[57] ABSTRACT

Electronic apparatus is contained in a heat dissipative external enclosure 2. The enclosure contains at least one unit contained in a thermally conductive internal housing 4,6 providing RF isolation and mounted on a wall 7 of the enclosure in thermal contact therewith. A wall 11 of the unit has a first recess 14 receiving the evaporator 13 of a heat pipe 12. The heat pipe is clamped between the external enclosure and the internal housing. The condenser 22 of the heat pipe is lower than the evaporator and is received by a recess 24 in the wall 7. The evaporator is clamped in the recess by a clamp member e.g. another unit 6.

Because the heat pipe is clamped at its ends, it does not need to be an interference fit in either recess and may thus easily be removed. The inner housing can maintain RF isolation.

4 Claims, 2 Drawing Sheets

ELECTRONIC APPARATUS

A FIELD OF THE INVENTION

This invention relates to electronic apparatus contained in a heat dissipative external enclosure.

DESCRIPTION OF THE RELATED ART

In the absence of forced convection, electronic apparatus will be hotter at the top of its external enclosure than at the bottom. The situation is worse for apparatus which is sealed for use outside where internally generated heat has to be dissipated by the external enclosure. Ideally components which dissipate large amounts of heat would be sited lower in the external enclosure than components which dissipate less heat. That is not always possible.

Heat pipes have been used to conduct heat away from components to cooler positions in the external enclosure. Conventionally, the evaporator of a heat pipe is in direct thermal contact with a power component e.g. by clamping or bonding. The condenser is conventionally pressed into a groove in the wall of the external enclosure, being an interference fit in the groove so as to ensure good thermal contact. The heat pipe has a round cross section and the groove has a corresponding round bottom. The step of pressing the heat pipe into the groove may also be used to distort the pipe so that it finishes flush with the top of the groove.

Removal of the heat pipe is virtually impossible which makes removal of the circuit board on which the component is mounted very difficult.

In some external enclosures individual units have to be isolated from one another against radio frequency (RF) interference by closed internal housings. It would be difficult to maintain the RF isolation around a heat pipe which would have to enter the internal housing.

SUMMARY OF THE INVENTION

Against this background there is provided electronic apparatus contained in a heat dissipative external enclosure, the external enclosure containing at least one unit contained in a thermally conductive internal housing providing RF isolation and mounted on a wall of the external enclosure in thermal contact therewith; a wall of the unit having therein a first recess receiving the evaporator of a heat pipe, the heat pipe being clamped between the external enclosure and the internal housing, the condenser of the heat pipe being lower, in use, than the evaporator, being received by a recess in the wall of the external enclosure and clamped therein by a clamp member.

Because the heat pipe is clamped at its ends, it does not need to be an interference fit in either recess and may thus easily be removed. The inner housing can maintain RF isolation.

The first recess is preferably located adjacent one or more power components inside the internal housing.

In order to reduce the size of the external enclosure, the condenser is preferably clamped in its recess by another unit which fulfils the function of clamp member. That other unit may comprise only low power components.

Most preferably the heat pipe has two opposed substantially flat sides, and the first and second recesses are flat bottomed. This simplifies machining the recesses, and allows the surface of the wall or clamp member opposite the first and second recess respectively to be plain.

BRIEF DESCRIPTION OF THE DRAWINGS

One embodiment of the invention will now be described, by way of example, with reference to the accompanying drawings, in which.

DETAILED DESCRIPTION

Figure 1:
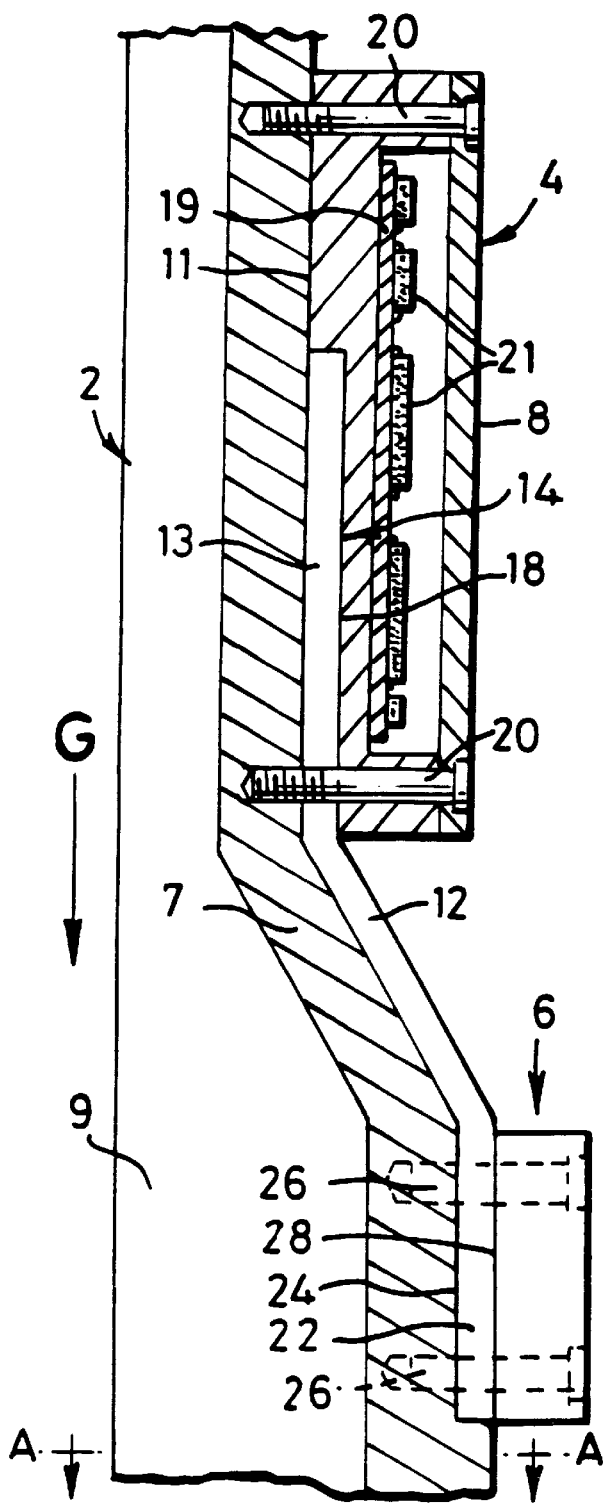
FIG. 1 is a schematic section through part of electronic apparatus embodying the invention and showing internal housings mounted on a wall of an external enclosure.
Figure 2:
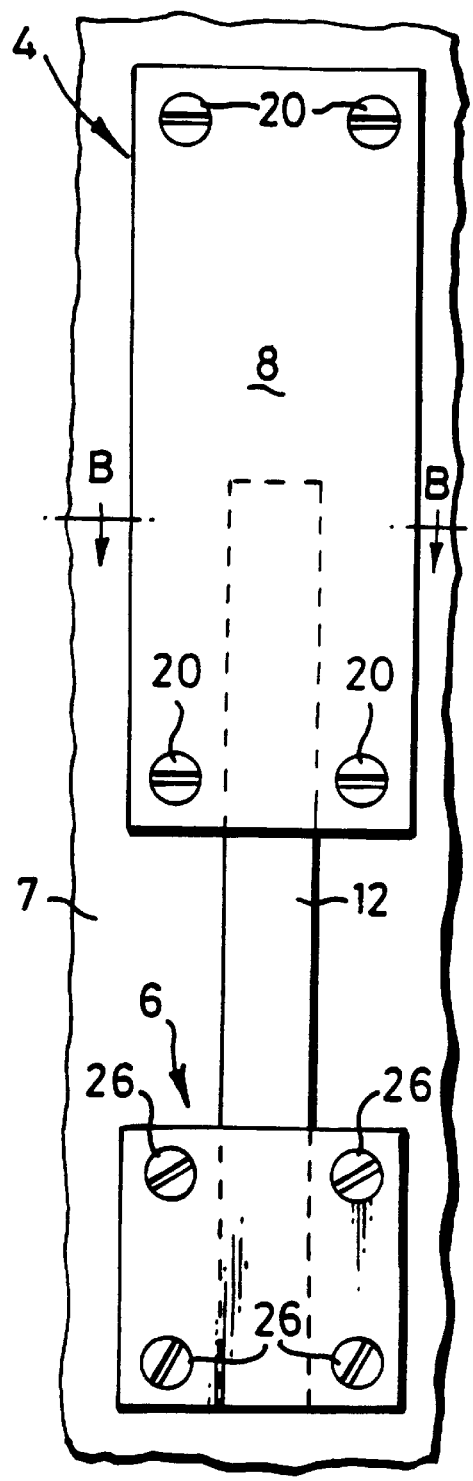
FIG. 2 is a view of the internal housings taken from the right of FIG. 1.
Figure 3:
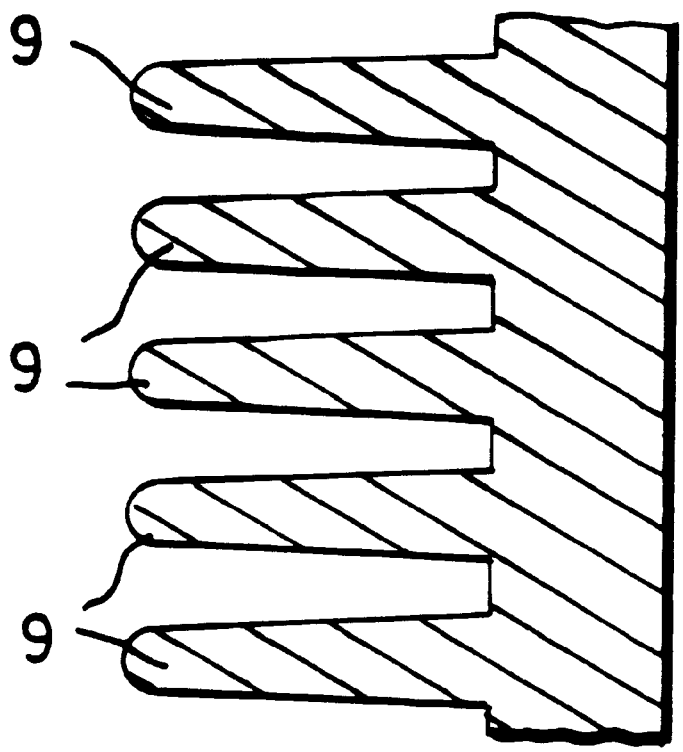
FIG. 3 is a section on arrows A-a of FIG. 1.

Referring to the drawings, a base station of a mobile communications network has electronic apparatus mounted in an external enclosure 2, only part of which is shown in the drawings. The enclosure contains, amongst other units, a wide band power amplifier 4, contained by an aluminium internal housing 8 to provide RF isolation, and a duplexer 6. The internal units, including the power amplifier 8 and the duplexer 6, are mounted in thermal contact with a wall 7 of the enclosure 2. The enclosure 2 is manufactured from light metal and has extended surfaces or fins 9 so as to dissipate heat generated by its internal units including the power amplifier 4 and the duplexer 6.

The enclosure 2 is environmentally sealed. Convection within the enclosure is not possible due to very small internal spaces left by the units contained therein. Convection round the external enclosure is not forced so the top of the enclosure is hotter significantly than the bottom. A relatively large amount of heat is generated by the power amplifier 4 compared with the duplexer 6 and it would be better to locate the power amplifier below the duplexer in a lower temperature. Other design constraints require the power amplifier 4 to be above the duplexer, however.

Figure 4:
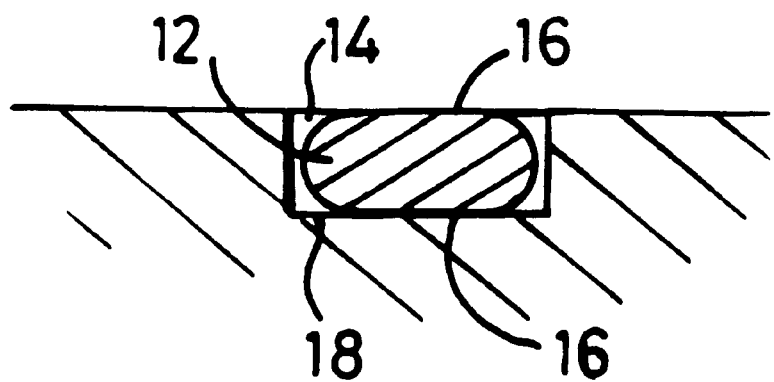
FIG. 4 is a sectional view of a heat pipe on arrows B-Bm in FIG. 2.

In order to reduce the temperature of the power amplifier 4, a heat pipe 12 is provided. The evaporator 13 of the heat pipe 12 is received by a recess 14 in the wall 11 of aluminium housing 8. The heat pipe has two generally flat opposed sides 16. The bottom 18 of the recess 14 is plain. The surface of the part of the wall 7 on which the power amplifier 4 is mounted is plain. The power amplifier 4 is mounted on the wall by four screws 20. The depth of the recess 14 compared to the thickness of the heat pipe between its flat sides is such that the heat pipe is clamped between the wall 7 and the bottom 18 of the recess in the housing 8. As may be seen in FIG. 4, the width of the recess is sufficient that the heat pipe 12 is a clearance fit and can easily be removed.

Inside the housing 8, components are mounted on a circuit board 19. The recess 14 locates the evaporator 13 adjacent power components 21, such as power transistors, which dissipate large amounts of heat.

The condenser 22 of the heat pipe 12 is received by a recess 24 in the wall 7. The bottom of the recess is plain. The width of the recess is sufficient that the condenser is a clearance fit so that it can easily be removed. The condenser is clamped in the recess by a clamp member in the form of the duplexer 6. The duplexer 6 is mounted by screws 26. It has a plain surface 28 for thermal contact with both the wall 7 and the heat pipe 12. The depth of the recess 24 compared to the thickness of the heat pipe between its flat sides is such that the heat pipe is clamped between the bottom of the recess 24 in the wall 7 and the plain surface 28 of the duplexer 6.

The invention claimed is:

1. Electronic apparatus contained in a heat dissipative external enclosure, the external enclosure containing at least one unit contained in a thermally conductive internal housing providing RF isolation and mounted on a wall of the external enclosure in thermal contact therewith; a wall of the unit having therein a first recess receiving the evaporator of a heat pipe, the heat pipe being clamped between the external enclosure and the internal housing, the condenser of the heat pipe being lower, in use, than the evaporator, being received by a recess in the wall of the external enclosure and clamped therein by a clamp member.

2. Electronic apparatus as claimed in claim 1, wherein the first recess is located adjacent one or more power components inside the internal housing.

3. Electronic apparatus as claimed in claim 1 or 2, wherein the condenser is clamped in its recess by another unit which fulfils the function of clamp member.

4. Electronic apparatus as claimed in any preceding claim, wherein the heat pipe has two opposed substantially flat sides, and the first and second recesses are flat bottomed.

* * * * *